United States Patent
Sakurai et al.

(10) Patent No.: US 6,180,322 B1
(45) Date of Patent: Jan. 30, 2001

(54) ALKALINE DEVELOPING SOLUTION FOR RADIATION SENSITIVE COMPOSITION AND DEVELOPMENT METHOD

(75) Inventors: Kouichi Sakurai; Takahiro Iijima, both of Mie; Yukiko Ito, Aichi; Hiroaki Nemoto, Mie, all of (JP)

(73) Assignee: JSR Corporation, Tokyo (JP)

( * ) Notice: Under 35 U.S.C. 154(b), the term of this patent shall be extended for 0 days.

(21) Appl. No.: 09/289,963

(22) Filed: Apr. 13, 1999

(51) Int. Cl.$^7$ ........................................ G03F 7/26
(52) U.S. Cl. ............................ 430/321; 430/331
(58) Field of Search ..................... 430/331, 321

(56) References Cited

U.S. PATENT DOCUMENTS

| | | | |
|---|---|---|---|
| 4,269,929 | * | 5/1981 | Nothnagle .................. 430/264 |
| 5,106,724 | * | 4/1992 | Nagami et al. ............... 430/331 |
| 5,234,796 | * | 8/1993 | Shimura et al. .............. 430/331 |
| 5,344,874 | * | 9/1994 | Doi et al. ..................... 524/593 |
| 5,447,821 | * | 9/1995 | Okada et al. ................. 430/331 |
| 5,635,328 | * | 6/1997 | Higashino et al. ........... 430/166 |
| 5,858,617 | * | 1/1999 | Nakayama et al. ........... 430/281.1 |

FOREIGN PATENT DOCUMENTS

| | | |
|---|---|---|
| 7-120935 | 5/1995 | (JP) . |
| 9-171261 | 6/1997 | (JP) . |

* cited by examiner

*Primary Examiner*—Hoa Van Le
(74) *Attorney, Agent, or Firm*—Oblon, Spivak, McClelland, Maier & Neustadt, P.C.

(57) ABSTRACT

An alkaline developing solution for a radiation sensitive composition, which has no undissolved products even when the concentration of a pigment contained in a radiation sensitive composition is high, which does not cause such problems as scum, the residue after development and re-adhesion, and which can form pixels having a sharp pattern edge.

The alkaline developing solution for a radiation sensitive composition is an aqueous solution which contains (A-1) at least one inorganic alkaline compound and (A-2) at least one organic alkaline compound selected from the group consisting of alkanolamines and alkylamines or which contains the above component (A-1), the above component (A-2) and (B) at least one nonionic surfactant selected from the group consisting of etherified polyoxyethylenes and etherified polyoxyethylene-polyoxypropylene block copolymers.

2 Claims, No Drawings

ALKALINE DEVELOPING SOLUTION FOR RADIATION SENSITIVE COMPOSITION AND DEVELOPMENT METHOD

FIELD OF THE INVENTION

The present invention relates to an alkaline developing solution for a radiation sensitive composition and to a development method. More specifically, it relates to an alkaline developing solution, which is advantageously used for a radiation sensitive composition used in the production of a color filter that is a constituent member of a color liquid crystal display, and to a development method.

PRIOR ART

A large number of proposals have been made on the production process of a color liquid crystal display (LCD). Recently, a process for aligning liquid crystals has been becoming popular that comprises forming a color filter having red, green and blue pixels and a black matrix on a transparent substrate such as glass, forming a transparent conductive film made from, for example, indium tin oxide (ITO) on the color filter by sputtering to form a transparent electrode and forming an alignment layer on the electrode.

There are several methods for producing such a color filter, as exemplified by such known methods as a pigment dispersion method, dying method, printing method and method for performing lamination in the same manner as a dry film. The pigment dispersion method is currently the most popular. In the pigment dispersion method, a color filter is produced by coating a radiation sensitive composition, which has an organic pigment and/or an inorganic pigment dispersed therein, by a spin coater to form a predetermined color pattern.

Heretofore, there have been only red, green and blue pixels for the color layer of a color filter produced by the pigment dispersion method. However, as described above, attempts have recently been made to form a light shading layer, which serves as a black matrix, from a radiation sensitive composition which has a pigment such as carbon black dispersed therein.

The radiation sensitive composition comprises an organic and/or inorganic pigment for coloration or light shading and a resin component, which can be cured by, for example, ultraviolet radiation and which is soluble in an alkaline developing solution, as essential ingredients. The pigment and the resin component must be quickly dispersed or dissolved in the alkaline developing solution when unnecessary portions are removed in the development step.

However, in reality, there frequently occur such a problem that the radiation sensitive composition to be completely removed at the time of development remains (the residue after development) and such a problem that the pigments and the resin component, which are removed from a glass substrate to be dispersed or dissolved in the alkaline developing solution, are re-adhered to the glass substrate, black matrix or cured color layer. These problems cause an irregular color distribution in the color filter or a defect such as an adhesion failure in the post-step. Therefore, an alkaline developing solution is strongly desired that can fully disperse or dissolve both the pigments and the resin component, which are contained in the radiation sensitive composition, to remove these in the development step.

As means for solving the above problems, JP-A 7-120935 (the term "JP-A" as used herein means an "unexamined published Japanese patent application") proposes an alkaline developing solution for a radiation sensitive composition, which is an aqueous solution containing an alkaline compound and 0.01 to 1.0 wt % of a nonionic surfactant and which has a pH of 9 to 13. JP-A 9-171261 proposes an alkaline developing solution for a negative color photosensitive composition, which is a buffer aqueous solution containing a nonionic surfactant and comprising a strong basic substance and a weak basic substance.

However, these developing solutions also have such a problem that, when the concentration of a pigment contained in the radiation sensitive composition is high, undissolved products are liable to remain in the development step where unnecessary portions are removed, thereby causing such problems as scum, the residue after development and re-adhesion and making it impossible to form pixels having a sharp pattern edge.

SUMMARY OF THE INVENTION

It is an object of the present invention to provide an alkaline developing solution for a radiation sensitive composition.

It is another object of the present invention to provide an alkaline developing solution for a radiation sensitive composition, which has no undissolved products even when the concentration of a pigment contained in the radiation sensitive composition is high, which does not cause such problems as scum, the residue after development and re-adhesion, and which can form pixels having a sharp pattern edge.

It is still another object of the present invention to provide a method for developing a radiation sensitive composition with the alkaline developing solution of the present invention.

Other objects and advantages of the present invention will become apparent from the following description.

According to the present invention, firstly, the above objects and advantages of the present invention are attained by an alkaline developing solution for a radiation sensitive composition (to be referred to as "the first developing solution of the present invention" hereinafter), which is an aqueous solution containing (A) (A-1) a water-soluble and alkaline inorganic compound and (A-2) at least one water-soluble and alkaline organic compound selected from the group consisting of alkanolamines and alkylamines.

Secondly, the above objects and advantages of the present invention are attained by an alkaline developing solution for a radiation sensitive composition (to be referred to as "the second developing solution of the present invention" hereinafter), which is an aqueous solution containing (A) (A-1) a water-soluble and alkaline inorganic compound and (A-2) at least one water-soluble or alkaline organic compound selected from the group consisting of alkanolamines and alkylamines and (B) at least one nonionic surfactant selected from the group consisting of etherified polyoxyethylenes and etherified polyoxyethylene-polyoxypropylene block copolymers.

Thirdly, the above objects and advantages of the present invention are attained by a development method (to be referred to as "development method of the present invention" hereinafter), which comprises developing a thin film, made from a radiation sensitive composition comprising an alkali-soluble resin and a radiation sensitive compound and having a latent image pattern, with the alkaline developing solution of claim 1 or 2 to form a thin film pattern.

The present invention will be explained in detail hereinafter.

Component (A-1)

The component (A-1) used in the first and second developing solutions of the present invention is a water-soluble and alkaline inorganic compound. Illustrative examples of the inorganic compound include sodium hydroxide, potassium hydroxide, sodium carbonate, potassium carbonate, sodium hydrogencarbonate, potassium hydrogencarbonate, calcium hydroxide and barium hydroxide. Of these, sodium hydroxide, potassium hydroxide, sodium carbonate, potassium carbonate and sodium hydrogencarbonate are preferred. They may be used alone or in combination of two or more.

Component (A-2)

The component (A-2) used in the first and second developing solutions of the present invention is a water-soluble and alkaline organic compound. The organic compound is selected from the group consisting of alkanolamines and alkylamines.

The alkanolamines include, for example, ethanolamine, 2-dimethylaminoethanol, 2-diethylaminoethanol, 2-(di-n-propylamino)ethanol, 2-(di-i-propylamino)ethanol, 2-(di-n-butylamino)ethanol, 3-dimethylamino-1-propanol, 3-diethylamino-1-propanol, 2-dimethylamino-1-propanol, 2-diethylamino-1-propanol, 4-dimethylamino-2-butanol, 4-diethylamino-2-butanol, 3-dimethylamino-2-butanol, 3-diethylamino-2-butanol, 5-dimethylamino-2-pentanol, 5-diethylamino-2-pentanol, 4-dimethylamino-2-pentanol and 4-diethylamino-2-pentanol.

The alkylamines include, for example, monomethylamine, dimethylamine, trimethylamine, monoethylamine, diethylamine, triethylamine, mono-n-propylamine, di-n-propylamine, mono-i-propylamine, di-i-propylamine, mono-n-butylamine and di-n-butylamine.

Of these, the component (A-2) in the first and second developing solutions of the present invention is preferably an alkanolamine, particularly preferably 2-dimethylaminoethanol, 2-diethylaminoethanol, 2-(di-i-propylamino) ethanol or 2-(di-n-butylamino) ethanol. They may be used alone or in combination of two or more.

Component (B)

The component (B) used in the second developing solution of the present invention is a nonionic surfactant. The nonionic surfactant is selected from the group consisting of etherified polyoxyethylenes and etherified polyoxyethylene-polyoxypropylene block copolymers. They may be used alone or in combination.

The etherified polyoxyethylene-polyoxypropylene block copolymers are preferably represented by the following formula (1) or (2).

$$RO-(C_2H_4O)_m-(C_3H_6O)_n-H \quad (1)$$

wherein R is an alkyl group having 1 to 20 carbon atoms, aryl group having 6 to 20 carbon atoms or aralkyl group having 7 to 20 carbon atoms, m is an integer of 10 to 250, and n is an integer of 5 to 200.

$$RO-(C_3H_6O)_n-(C_2H_4O)_m-H \quad (2)$$

wherein R, n and m are the same as defined in the above formula (1).

The etherified polyoxyethylenes are preferably represented by the following formula (3).

$$R^1O-(C_2H_4O)_p-H \quad (3)$$

wherein $R^1$ is an alkyl group having 1 to 20 carbon atoms, aryl group having 6 to 20 carbon atoms or aralkyl group having 7 to 20 carbon atoms, and p is an integer of 10 to 250.

The alkyl group having 1 to 20 carbon atoms, denoted by R in the above formulas (1) and (2) and $R^1$ in the above formula (3), may be either straight-chain or branched-chain, as exemplified by methyl, ethyl, n-propyl, isopropyl, n-butyl, sec-butyl, t-butyl, pentyl, hexyl, octyl, nonyl, decyl, dodecyl, pentadecyl, octadecyl and eicosyl.

The aryl group having 6 to 20 carbon atoms is exemplified by phenyl, tolyl, xylyl, cumyl, octylphenyl, diphenyl and naphthyl.

The aralkyl group having 7 to 20 carbon atoms Is exemplified by benzyl and phenethyl.

The HLB value of the nonionic surfactant (B) is preferably in the range of 12 to 18.

Illustrative examples of commercially available products of the etherified polyoxyethylenes having an HLB value of 12 to 18 include EMULGEN A-60, EMULGEN A-90, EMULGEN A-500, EMULGEN B-66 and EMULGEN L-40 (of Kao Corporation).

Illustrative examples of commercially available products of the etherified polyoxyethylene-polyoxypropylene block copolymers having an HLB value of 12 to 18 include PEPOL A1758, PEPOL A1558, SORPOL T420 and SORPOL T416 (of TOHO CHEMICAL INDUSTRY Co., Ltd.).

Alkaline Developing Solution

The first developing solution is an aqueous solution comprising the component (A-1) and the component (A-2), and the second developing solution is an aqueous solution comprising the component (A-1), the component (A-2) and the component (B). Of these, the second developing solution is preferred.

The first and second developing solutions preferably have a pH of 9 to 13, more preferably 10 to 12.5. If the pH is less than 9, the residue may remain after development. On the other hand, if the pH is more than 13, some pixels may be lost or the film may peel off.

The weight ratio of the component (A-1) to the component (A-2) in the first and second developing solutions is preferably 4/1 to 1/5, more preferably 2/1 to 1/4.

Further, the content of the component (B) in the second developing solution is preferably 0.01 to 1% by weight, more preferably 0.05 to 0.5% by weight. If the content of the component (B) is smaller than 0.01 wt %, there may be produced scum and the residue after development and re-adhesion may occur. On the other hand, if the content is larger than 1 wt %, the developing solution readily foams, whereby work efficiency in development may lower.

The weight ratio of the total of the components (A-1) and (A-2) to the component (B) in the second developing solution is preferably 1/9 to 9/1, more preferably 2/8 to 8/2.

Such alkaline developing solutions can be advantageously used to develop a coated film formed from a radiation sensitive composition having silica particles or fine particles of a pigment dispersed therein and a coated film formed from a radiation sensitive composition containing none of these fine particles. Even when a color filter is formed from a radiation sensitive composition having a high concentration of fine particles, the alkaline developing solutions can fully disperse or dissolve unnecessary fine particles and an unnecessary resin component in the development step, does not cause such problems as scum, the residue after development and re-adhesion, and prevents the formed pattern from peeling off from a glass substrate, thereby making it possible to form pixels having a sharp pattern edge.

Therefore, according to the present invention, there is also provided the development method of the present invention as described above.

Consequently, the first and second developing solutions can be extremely advantageously used, particularly when a color filter is formed from a radiation sensitive resin composition for a color filter having the following composition. Further, it can also be preferably used when a resist pattern is formed from a radiation sensitive composition for forming the resist pattern.

The above radiation sensitive resin composition for a color filter is generally a composition that has an organic and/or inorganic pigment, an alkali-soluble resin and a radiation sensitive component dispersed or dissolved in an organic solvent.

Specific examples of the alkali-soluble resin include a (meth)acrylic acid/methyl (meth)acrylate copolymer, (meth)acrylic acid/benzyl (meth)acrylate copolymer, (meth)acrylic acid/2-hydroxyethyl (meth)acrylate/benzyl (meth)acrylate copolymer, (meth)acrylic acid/methyl (meth)acrylate/polystyrene macromonomer (monomer having a (meth)acrylate group at one terminal of a polystyrene chain, which shall apply hereinafter) copolymer, (meth)acrylic acid/methyl (meth)acrylate/polymethyl methacrylate macromonomer (monomer having a (meth)acrylate group at one terminal of a polymethyl (meth)acrylate chain, which shall apply hereinafter) copolymer, (meth)acrylic acid/benzyl (meth)acrylate/polystyrene macromonomer copolymer, (meth)acrylic acid/benzyl (meth)acrylate/polymethyl methacrylate macromonomer copolymer, (meth)acrylic acid/2-hydroxyethyl (meth)acrylate/benzyl (meth)acrylate/polystyrene macromonomer copolymer, (meth)acrylic acid/2-hydroxyethyl (meth)acrylate/benzyl (meth)acrylate/polymethyl methacrylate macromonomer copolymer, (meth)acrylic acid/styrene/benzyl (meth)acrylate/N-phenylmaleimide copolymer, (meth)acrylic acid/mono{2-(meth)acryloyloxyethyl}succinate/styrene/benzyl (meth)acrylate/N-phenylmalelmlde copolymer, (meth)acrylic acid/mono{2-(meth)acryloyloxyethyl}succinate/styrene/allyl (meth)acrylate/benzyl (meth)acrylate/N-phenylmaleimide copolymer and (meth)acrylic acid/benzyl (meth)acrylate/N-phenylmaleimide/styrene/glycerol mono(meth)acrylate copolymer and the like.

These alkali-soluble resins may be used alone or in combination of two or more.

The weight average molecular weight in terms of styrene (to be simply referred to as "weight average molecular weight" hereinafter), measured by a gel permeation chromatography (GPC using tetrahydrofuran as an eluting solvent), of the above alkali-soluble resin is preferably 3,000 to 300,000, particularly preferably 5,000 to 100,000.

The above radiation sensitive component is a component which generates a radical (a fraction of an active molecule) such as carbene or nitrene when irradiated with radiation (to be referred to as "exposure" hereinafter) and which forms a three-dimensional crosslinking structure in the alkali-soluble resin. The component is exemplified by a component containing a photopolymerization initiator and a polyfunctional monomer or a mixture of the polyfunctional monomer and a monofunctional monomer.

The term "radiation" as used herein includes visible radiation, ultraviolet radiation, far ultraviolet radiation, electron beams and X-rays.

EXAMPLES

The following examples are provided for the purpose of further illustrating the present invention but are in no way to be taken as limiting. "Parts" and "%" in the following examples are based an weight unless otherwise stated.

Examples 1 to 8

After a 20% aqueous solution of a mixture of the components (A-1) and (A-2) shown in Table 1 was added to water containing the component (B) shown in Table 1, the pH of the resulting solution was adjusted to a value shown in Table 1 to prepare an alkaline developing solution.

Separately, 130 parts of C.I. Pigment Red 177 as an organic pigment; 60 parts of a methacrylic acid/2-hydroxyethyl methacrylate/benzyl methacrylate copolymer (weight ratio of 15/15/70, weight average molecular weight of 28,000) as an alkali-soluble resin; 40 parts of dipentaerythrltol hexaacrylate as a polyfunctional monomer; 10 parts of 2,2'-bis(2,4-dichlorophenyl)-4,4',5,5'-tetraphenyl-1,2'-biimidazole, 10 parts of 4,4'-bis(diethylamino) benzophenone and 50 parts of 2-benzyl-2-dimethylamino-1-(4-morpholinophenyl)butan-1-one as photopolymerization initiators; and 1,000 parts of ethyl 3-ethoxyproplonate as a solvent were mixed together to prepare a liquid radiation sensitive composition. The concentration of the pigment at this point was about 43 wt % of the total solids content.

Thereafter the above liquid composition was coated on a soda glass substrate, which has a silicon dioxide ($SiO_2$) layer formed thereon for preventing the eluation of sodium ions, by a spin coater and the resulting substrate was prebaked at 80° C. for 10 minutes to form a 2.0-$\mu$m-thick coated film.

Thereafter, the substrate was cooled to room temperature, and the coated film thereof was exposed to ultraviolet radiation having a wavelength of 365 nm, 405 nm and 436 nm at a dosage of 100 mJ/cm$^2$ through a photomask using a high-pressure mercury lamp.

Then, the resulting coated film was developed by immersing the exposed substrate in 200 g of each of the alkaline developing solutions and vibrating it gently, and then washed with pure water to form pixels.

Observing the obtained pixels through a microscope, defects were observed in none of the pixels and the pixels had a sharp pattern edge. Scum, the film residues after development and the re-adhesion of the organic pigment and the resin component were not observed on the surface, on which no pixels were formed, of each of the substrates.

TABLE 1

|  | Component (A-1) | Component (A-2) | Weight ratio of component (A-1) to component (A-2) | Component (B) (*1) (g) | Water (g) | pH |
|---|---|---|---|---|---|---|
| Example.1 | KOH | 2-dimethylaminoethanol | 2/8 | 3 | 1000 | 10.8 |
| Example.2 | KOH | 2-dimethylaminoethanol | 4/6 | 3 | 1000 | 11.5 |
| Example.3 | KOH | 2-dimethylaminoethanol | 6/4 | 3 | 1000 | 12.5 |
| Example.4 | KOH | 2-dimethylaminoethanol | 4/6 | 1 | 1000 | 11.7 |
| Example.5 | NaOH | 2-dimethylaminoethanol | 4/6 | 3 | 1000 | 11.4 |
| Example.6 | KOH | 2-dimethylaminoethanol | 4/6 | 3 | 1000 | 11.6 |

TABLE 1-continued

| | Component (A-1) | Component (A-2) | Weight ratio of component (A-1) to component (A-2) | Component (B) (*1) (g) | Water (g) | pH |
|---|---|---|---|---|---|---|
| Example.7 | KOH | 2-(di-i-propylamino)ethanol | 4/6 | 3 | 1000 | 12.0 |
| Example.8 | KOH | 2-(di-n-butylamino)ethanol | 4/6 | 3 | 1000 | 11.8 |

(*1) EMULGEN A-60

Examples 9 to 16

After a 20% aqueous solution of a mixture of the components (A-1) and (A-2) shown in Table 2 was added to water containing the component (B) shown in Table 2, the pH of the resulting solution was adjusted to a value shown in Table 2 to prepare an alkaline developing solution.

Thereafter, pixels were formed in the same manner as in Example 1.

Observing the obtained pixels through a microscope, defects were observed in none of the pixels and the pixels had a sharp pattern edge. Scum, the film residues after development and the re-adhesion of the organic pigment and the resin component were not observed on the surface, on which no pixels were formed, of each of the substrates.

TABLE 2

| | Component (A-1) | Component (A-2) | Weight ratio of component (A-1) to component (A-2) | Component (B) (*2) (g) | Water (g) | pH |
|---|---|---|---|---|---|---|
| Example.9 | KOH | 2-dimethylaminoethanol | 2/8 | 3 | 1000 | 10.7 |
| Example.10 | KOH | 2-dimethylaminoethanol | 4/6 | 3 | 1000 | 11.5 |
| Example.11 | KOH | 2-dimethylaminoethanol | 6/4 | 3 | 1000 | 12.4 |
| Example.12 | KOH | 2-dimethylaminoethanol | 4/6 | 1 | 1000 | 11.7 |
| Example.13 | NaOH | 2-dimethylaminoethanol | 4/6 | 3 | 1000 | 11.3 |
| Example.14 | KOH | 2-dimethylaminoethanol | 4/6 | 3 | 1000 | 11.5 |
| Example.15 | KOH | 2-(di-i-propylamino)ethanol | 4/6 | 3 | 1000 | 12.0 |
| Example.16 | KOH | 2-(di-n-butylamino)ethanol | 4/6 | 3 | 1000 | 11.8 |

(*2) PEPOL A1758

Comparative Examples 1 to 3

After a 20% aqueous solution of the component (A-1) or other organic alkaline compound shown in Table 3 was added to water containing the component (B) shown in Table 3, the pH of the resulting solution was adjusted to a value shown in Table 3 to prepare an alkaline developing solution.

Thereafter, pixels were formed in the same manner as in Example 1.

Observing the obtained pixels through a microscope, no defects were observed in pixels obtained in Comparative Example 1 but the pixels did not have a sharp pattern edge, and scum was observed on the surface, on which no pixels were formed, of the substrate. In the case of the pixels obtained in Comparative Example 2, no defects were observed but film residues were observed on the surface, on which no pixels were formed, of the substrate. Pixels obtained in Comparative Example 3 did not have a sharp pattern edge and a considerable amount of film residues were observed on the surface, on which no pixels were formed, of the substrate.

TABLE 3

| | Component (A-1) | Other organic alkaline compound | Component (B) (*1) (g) | Water (g) | pH |
|---|---|---|---|---|---|
| C.Ex.1 | KOH | — | 3 | 1000 | 11.3 |
| C.Ex.2 | KOH | — | 1 | 1000 | 12.0 |
| C.Ex.3 | — | tetramethyl ammonium hydroxide | 2 | 1000 | 10.5 |

C.Ex.: Comparative Example
(*1) EMULGEN A-60

The alkaline developing solution for a radiation sensitive composition according to the present invention can fully disperse or dissolve unnecessary portions to remove them without causing the detachment of a coated film formed from a radiation sensitive composition for a color filter, particularly when the coated film is developed, even if the concentration of a pigment contained in the radiation sensitive composition is high. Therefore, it can form pixels having a sharp pattern edge without causing such problems as scum, film residues and re-adhesion.

What is claimed is:

1. A development method comprising developing a thin film, made from a radiation sensitive composition comprising an alkali-soluble resin and a radiation sensitive compound and having a latent image pattern, with an alkaline developing solution to form a thin film pattern, wherein the alkaline developing composition is an aqueous solution containing (A) (A-1) a water-soluble and alkaline inorganic compound and (A-2) at least one water-soluble and alkaline organic compound selected from the group consisting of 2-dimethylaminoethanol, 2-diethylaminoethanol, 2-(diisopropylamino)ethanol and 2-(di-n-butylamino)

ethanol, and wherein said radiation sensitive composition further comprises silica particles or fine pigment particles.

2. The developing method of claim 1, wherein the water-soluble and alkaline inorganic compound (A-1) is at least one compound selected from the group consisting of sodium hydroxide, sodium carbonate, potassium hydroxide, potassium carbonate and sodium hydrogencarbonate.

* * * * *

UNITED STATES PATENT AND TRADEMARK OFFICE
CERTIFICATE OF CORRECTION

PATENT NO. : 6,180,322 B1
DATED : January 30, 2001
INVENTOR(S) : Sakurai et al.

It is certified that error appears in the above-identified patent and that said Letters Patent is hereby corrected as shown below:

Title page,
Item [75], should read as follows:
-- [75] Inventors: Kouichi Sakurai; Takahiro Iijima, both of Mie; Yukiko Itou, Aichi; Hiroaki Nemoto, Mie, all of (JP) --
Item [45], should read
-- [45] Date of Patent: *Jan. 30, 2001 --
Item [*] Notice, should read
-- [*] Notice: This patent issued on a continued prosecution application filed under 37 CFR 1.53(d), and is subject to the twenty year patent term provisions of 35 U.S.C. 154 (a)(2). --

Signed and Sealed this

Twenty-sixth Day of July, 2005

JON W. DUDAS
*Director of the United States Patent and Trademark Office*